(12) United States Patent
Park et al.

(10) Patent No.: US 6,398,874 B2
(45) Date of Patent: Jun. 4, 2002

(54) USE OF ALKOXY N-HYDROXYALKYL ALKANAMIDE AS RESIST REMOVING AGENT, COMPOSITION FOR REMOVING RESIST, METHOD FOR PREPARING THE SAME AND RESIST REMOVING METHOD USING THE SAME

(75) Inventors: Dong-jin Park, Osan; Jin-ho Hwang, Suwon; June-ing Gil, Hwasung-gun; Je-eung Park, Suwon; Sang-mun Chon, Sungnam, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/884,992

(22) Filed: Jun. 21, 2001

Related U.S. Application Data

(60) Division of application No. 09/348,829, filed on Jul. 8, 1999, now Pat. No. 6,274,537, which is a continuation-in-part of application No. 09/140,334, filed on Aug. 26, 1998, now abandoned, and a continuation-in-part of application No. 09/140,333, filed on Aug. 26, 1998, now abandoned.

(30) Foreign Application Priority Data

| Aug. 5, 1998 | (KR) | 98-32354 |
| Aug. 5, 1998 | (KR) | 98-32355 |
| Jun. 7, 1999 | (KR) | 99-20973 |

(51) Int. Cl.[7] ............... B08B 3/04; C11D 3/30; C11D 9/30
(52) U.S. Cl. ............... 134/2; 134/1.3; 134/38; 134/39; 134/40; 510/176; 510/175; 510/386; 510/488; 510/493; 510/501; 510/502
(58) Field of Search ............... 134/1.3, 2, 38, 134/39, 40; 510/176, 175, 386, 488, 493, 501, 502

(56) References Cited

U.S. PATENT DOCUMENTS 5,707,947 A * 1/1998 Ward et al. ............... 510/176
6,274,537 B1 * 8/2001 Park et al. ............... 510/176

FOREIGN PATENT DOCUMENTS

| GB | 2199587 A | * | 7/1988 |
| GB | 2340256 A | * | 2/2000 |
| JP | 2131239 | * | 5/1990 |
| JP | 11125917 | * | 5/1999 |

OTHER PUBLICATIONS

Darbinyan et al, Synthesis of azole derivatives and polymers based on them, Inst. Org. Khi., Erevan, USSR, abstract only.*

* cited by examiner

*Primary Examiner*—Mark Kopec
*Assistant Examiner*—Brian P. Mruk
(74) *Attorney, Agent, or Firm*—Volentine Francos, PLLC

(57) ABSTRACT

A resist removing agent and a resist removing composition, having an excellent capability for removing a resist and polymer and which does not attack underlying layers, a method for preparing the same and a resist removing method using the same. The resist removing agent includes alkoxy N-hydroxyalkyl alkanamide. The resist removing composition includes alkoxy N-hydroxyalkyl alkanamide, and at least one compound selected from a group consisting of a polar material having a dipole moment of 3 or greater, an attack inhibitor and alkanolamine. A substrate having the resist thereon is brought into contact with the resist removing agent or resist removing composition to remove the resist.

15 Claims, 8 Drawing Sheets

USE OF ALKOXY N-HYDROXYALKYL ALKANAMIDE AS RESIST REMOVING AGENT, COMPOSITION FOR REMOVING RESIST, METHOD FOR PREPARING THE SAME AND RESIST REMOVING METHOD USING THE SAME

This application is a divisional of application Ser. No. 09/348,829 filed Jul. 8, 1999 U.S. Pat. No. 6,274,537, (which in turn is a continuation-in-part (CIP) of application Ser. Nos. 09/140,334 and 09/140,333 now abandoned; both filed Aug. 26, 1998 and assigned to the assignee of the present application, each disclosure of which is incorporated herein by reference in its entirety.

BACKGROUND OF THE INVENTION

1. Field of the Invention

The present invention relates to a resist removing agent, a composition for removing resist, a method for preparing the same and a resist removing method using the same. In particular, the present invention relates to use of an alkoxy N-hydroxyalkyl alkanamide as a resist removing agent, a composition for removing resist, a method for preparing the same, and a resist removing method using the same.

2. Description of the Related Art

The resist removing process is a major process in preparing a semiconductor device. After various processes for preparing a semiconductor device, e.g., an etching process (dry or wet) or an ion implantation process, a resist pattern used as a mask must be removed. Also, in the case when the resist pattern is misaligned, it must be removed to form a new resist pattern. In particular, various different material layers, e.g., an oxide layer, an aluminum layer, a copper layer, a polysilicon layer, a silicide layer or a polyimide layer, may be present under a resist layer to be removed. Therefore, an important consideration for a resist removing process is to remove a resist completely, as quickly as possible, and without attacking underlying layers.

A resist removing agent currently in wide use includes a basic amine such as hydroxyamine, diglycolamine, monoethanolamine or methylethanolamine, and a polar solvent such as water or alcohol, as its essential components.

Since such conventional resist removing agents cannot remove polymer completely, a pre-removal step for removing polymer is further necessary. Polymer is a material produced by reaction of components constituting the resist pattern, such as carbon (C), hydrogen (H), or oxygen (O), and plasma when plasma etching or reactive ion etching (RIE) is performed to etch the underlying layers using the resist pattern as a mask. Particularly, when a metal layer is formed under the resist pattern, an organometallic polymer is produced. If such a polymer or organometallic polymer is not removed, but remains in a contact hole or a via hole, contact resistance increases. Thus, before using the resist removing agent, a cleaning reinforcement agent capable of removing polymer, e.g., a nitric acid solution ($HNO_3$), must be used to treat the substrate during a pre-removal step.

The conventional resist removing agent may attack the underlying layers. A typical example of an underlying layer liable to be attacked is a metal layer. The reason for the foregoing is because the resist removal agent is mainly comprised of a basic solvent or water which easily corrodes the metal layer. Thus, a post-removal step for preventing the attack must be further carried out before executing a post-removal rinse step. In the post-removal step, isopropyl alcohol (IPA) is used for example.

Therefore, since a nitric acid treatment step (i.e., a pre-removal step) and an isopropyl alcohol treatment step (i.e., a post-removal step) are further performed, the resist removal process becomes more complicated and processing time is prolonged, thereby lowering productivity. Also, since a pre-removal material, e.g., nitric acid and a post-removal material, e.g., isopropyl alcohol, are further required as well as the resist removal material, the manufacturing cost increases. In addition, since various baths for the pre-removal step and the post-removal step are required, a resist removing apparatus becomes unnecessarily bulky.

SUMMARY OF THE INVENTION

A first objective of the present invention is to provide a resist removing agent having an excellent capability for removing a resist and polymer and which does not attack underlying layers exposed to the resist removing agent.

A second objective of the present invention is to provide a composition for removing resist, having an excellent capability for removing a resist and polymer and which does not attack underlying layers exposed to the resist removing agent.

A third objective of the present invention is to provide a method for preparing the resist removing agent.

A fourth objective of the present invention is to provide a method for removing a resist using the resist removing composition.

Accordingly, to achieve the above objectives and other objects and advantages of the present invention, there is provided a resist removing agent comprising alkoxy N-hydroxyalkyl alkanamide.

In another aspect of the present invention, the resist removing composition includes alkoxy N-hydroxyalkyl alkanamide, and at least one of a polar material having a dipole moment of 3 or greater and an attack inhibitor.

According to another aspect of the present invention, the resist removing composition includes alkoxy N-hydroxyalkyl alkanamide and alkanolamine. The composition may further include at least one of a polar material having a dipole moment of 3 or greater and an attack inhibitor.

In another aspect of the present invention, the method for preparing alkoxy N-hydroxyalkyl alkanamide includes mixing alkanolamine and alkyl alkoxy alkanoate, and reacting the mixture of alkanolamine and alkyl alkoxy alkanoate.

To achieve the fourth objective, there is provided a method for removing resist including providing a substrate, forming a resist on the substrate, contacting the substrate with a resist removing agent comprising alkoxy N-hydroxyalkyl alkanamide or a resist removing composition to remove the resist from the substrate, the resist removing composition comprising alkoxy N-hydroxyalkyl alkanamide, and at least one compound selected from the group consisting of a polar material having a dipole moment of 3 or greater, an attack inhibitor, and alkanolamine.

The resist removing agent or resist removing composition according to the present invention has an excellent capability for removing the resist, and is capable of effectively removing polymer and organometallic polymer, and does not attack the underlying layers exposed to the resist removing agent or composition.

DESCRIPTION OF THE PREFERRED EMBODIMENTS

Figure 1:
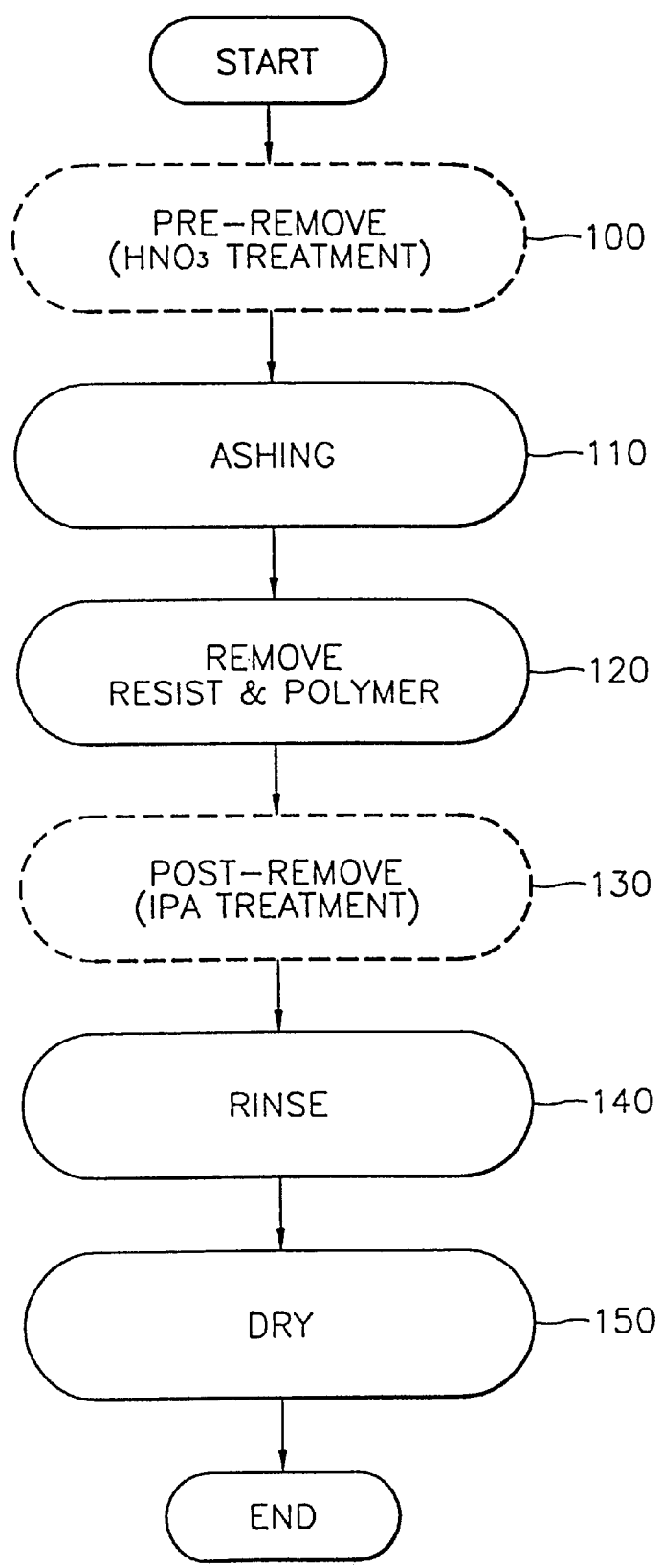
FIG. 1 is a flow diagram, wherein the solid lines indicate a process of removing a resist and polymer using a resist removing agent or a resist removing composition according to the present invention, and the dashed lines indicate the conventional steps eliminated by using the present invention.

Hereinbelow, a resist removing agent and a resist removing composition according to the present invention will be described, and a method for preparing the same, a method for removing a resist using the same, and a resist removing apparatus used in the resist removing method will be described in detail. The present invention may, however, be embodied in many different forms and should not be construed as limited to the embodiments set forth herein. Rather, these embodiments are provided so that this disclosure will be thorough and complete, and will fully convey the scope of the present invention to those skilled in the art.

Resist Removing Agent

A resist removing agent according to the present invention includes an alkoxy N-hydroxyalkyl alkanamide. In detail, the alkoxy N-hydroxyalkyl alkanamide is represented by formula (I):

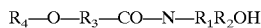  (I)

wherein $R_1$ is a hydrogen atom, a $C_1$ to $C_5$ hydrocarbon (i.e., a non-ring hydrocarbon with 1 to 5 carbon atoms), or an aromatic hydrocarbon having 1 to 3 rings; $R_2$ is a $C_1$ to $C_5$ hydrocarbon or an aromatic hydrocarbon having 1 to 3 rings; and $R_3$ and $R_4$ are each any of the $C_1$ to $C_5$ hydrocarbons, independent of each other.

In the preferred embodiment, $R_1$ is a hydrogen atom, $R_2$ is $-CH_2CH_2-$, $R_3$ is $-CH_2CH_2-$, and $R_4$ is $-CH_3$.

The resist removing agent according to the present invention contains a hydroxy group (—OH), an alkoxy group (—$OR_4$) and a carbonyl group (C=O). Consequently, the resist removing agent according to the present invention is very effective in exfoliation and dissolution of a resist and polymer.

Also, as shown in the following reaction formula (1), the resist removing agent reacts with an organometallic polymer, thereby easily removing the organometallic polymer from the surface of a substrate:

(Reaction formula 1)

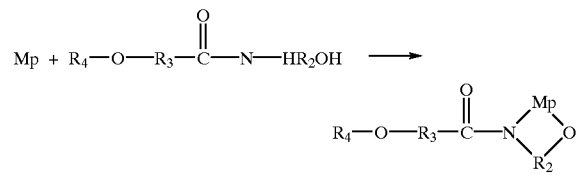

wherein Mp represents an organometallic polymer.

Resist Removing Composition

Embodiment 1

A resist removing composition according to a first embodiment of the present invention includes an alkoxy N-hydroxyalkyl alkanamide, and at least one of a polar material having a dipole moment of 3 or greater and an attack inhibitor.

The alkoxy N-hydroxyalkyl alkanamide is a compound represented by the above-described formula (I).

The polar material having a dipole moment of 3 or greater exhibits a high solubility with respect to cross-linked polymer and resist. In other words, the polymer strongly bonded on the side walls of the resist pattern and the surface of the exposed underlying layer can be effectively removed by such polar material. Also, resist removal itself is facilitated by such polar material. For the polar material having a dipole moment of 3 or greater, water, methanol or dimethyl sulfoxide may be employed.

The attack inhibitor prevents various layers exposed to the resist removing composition, particularly, metal layers, from being attacked. The attack inhibitor is represented by the following formula (II):

  (II)

wherein $R_6$ is a $C_1$ to $C_5$ hydrocarbon, a $C_1$ to $C_5$ hydrocarbon having a —COOH group, an aromatic hydrocarbon having 1 to 3 rings, or an aromatic hydrocarbon having 1 to 3 rings and a —COOH group in at least one ring. The integer n may have a value between and inclusive of 1 and 4.

Particularly, it is preferred that $R_6$ is a benzene ring and the attack inhibitor is catechol in which n is 2. Also, gallic acid is a widely known attack inhibitor represented by formula (II) that may be used within the present invention.

The attack inhibition mechanism for a metal layer is illustrated by the following reaction formula (2) for the case when the attack inhibitor is catechol:

(Reaction formula 2)

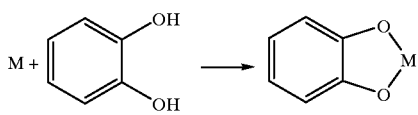

wherein M represents a metal.

Embodiment 2

A resist removing composition according to a second embodiment of the present invention includes the alkoxy N-hydroxyalkyl alkanamide and alkanolamine.

The alkanolamine is a compound represented by the following formula (III):

$$R_1—NH—R_2OH \quad (III)$$

wherein $R_1$ is hydrogen, a $C_1$ to $C_5$ hydrocarbon or an aromatic hydrocarbon having 1 to 3 rings, and $R_2$ is a $C_1$ to $C_5$ hydrocarbon or an aromatic hydrocarbon having 1 to 3 rings. In a preferred embodiment $R_1$ is hydrogen and $R_2$ is monoethanolamine, that is, $—CH_2CH_2—$.

The alkanolamine is also effective in removing an organometallic polymer. The organometallic polymer removing mechanism of the alkanolamine is represented by the following reaction formula (3) for the case of monoethanolamine:

(Reaction formula 3)

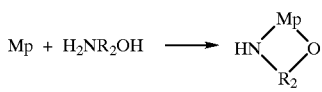

wherein Mp represents an organometallic polymer.

Preferably, the resist removing composition according to a second embodiment of the present invention further includes at least one of the polar material having a dipole moment of 3 or greater and the attack inhibitor.

The resist removing compositions according to the present invention and weight % of various components are expressed in the following Table 1. In Table 1, the contents of the preferred compositions are given in parentheses.

TABLE 1

Resist Removing Compositions

| Composition for removing resist | Alkoxy N-hydroxy-alkyl alkanamide (weight %) | Alkanol amine (weight %) | Polar material (weight %) | Attack inhibitor (weight %) |
|---|---|---|---|---|
| 1 | 30 to 99.99 | | 0.01 to 70 | |
| 2 | 30 to 99.99 | | | 0.01 to 70 |
| 3 | 30 to 99.98 | | 0.01 to 40 | 0.01 to 40 |
|   | (40 to 60) | | (20 to 30) | (20 to 30) |
| 4 | 30 to 99.9 | 0.1 to 70 | | |
| 5 | 30 to 99.89 | 0.1 to 40 | 0.01 to 30 | |
| 6 | 30 to 99.89 | 0.1 to 40 | | 0.01 to 30 |
| 7 | 30 to 99.88 | 0.1 to 40 | 0.01 to 30 | 0.01 to 30 |
|   | (40 to 65) | (5 to 30) | (5 to 20) | (5 to 20) |

The contents of the above-described compositions are optimal contents in which a resist and polymer can be effectively removed, and the layer underlying the resist, e.g., a metal layer, exposed to a resist removing agent or a resist removing composition, is minimally attacked by such compositions.

Among the above compositions, compositions 3 and 7, which include both a polar material and an attack inhibitor, are the most effective for removing resist and polymer. Also, in the case when there is a metal layer underlying the resist, they do attack the metal layer.

However, compositions 1, 4 and 5, which do not include an attack inhibitor, may also achieve the same effect as compositions 3 and 7 in the case when a material normally attacked by a resist removing composition, such as a metal layer, is not exposed to the resist removing composition. Also, compositions 2, 4 and 6, which do not include a polar material having a dipole moment of 3 or greater, may also achieve the same effect as compositions 3 and 7 in the case when attack inhibition of a metal layer is a more important factor, the amount of polymer to be removed is very small, or a pre-removal step has been carried out.

As described above, the resist removing agent or resist removing compositions have excellent capability for removing the resist and the polymer which is an etching by-product. Also, they do not attack the layer underlying the resist, e.g., a metal layer. In addition, the above-described materials are cheaper than the components of the conventional resist removing compositions.

Method for Preparing Resist Removing Agent

An alkoxy N-hydroxyalkyl alkanamide according to the present invention is prepared by reacting alkanolamine represented by formula (III) and alkyl alkoxy alkanoate represented by formula (IV), as represented by the following reaction formula (4):

(Reaction formula 4)

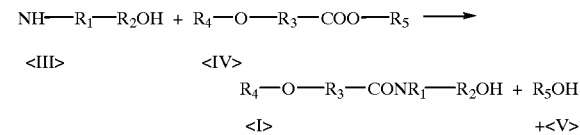

wherein $R_1$ is a hydrogen atom, a $C_1$ to $C_5$ hydrocarbon, or an aromatic hydrocarbon having 1 to 3 rings; $R_2$ is a $C_1$ to $C_5$ hydrocarbon or an aromatic hydrocarbon having 1 to 3 rings; and $R_3$, $R_4$ and $R_5$ are each any of the $C_1$ to $C_5$ hydrocarbons, independent of each other.

The alkanolamine is preferably monoethanolamine in which $R_1$ is a hydrogen atom and $R_2$ is $—CH_2CH_2—$, and the alkyl alkoxy alkanoate is preferably methyl methoxy propanoate in which $R_3$ is $—CH_2CH_2—$, $R_4$ is $—CH_3$ and $R_5$ is $—CH_3$.

Here, to supply energy sufficient for this reaction, the reaction temperature is maintained at a temperature in the range from room temperature to about 120° C. In the preferred embodiment of the method, the mixture is heated to a temperature in the range from about 80° C. to about 90° C.

As understood from the above reaction formula, amine (III) is reacted with ester (IV) to produce amide (I) and alcohol (V).

While the alcohol (V) is a $C_1$ to $C_5$ alcohol having a low boiling point, for example, methanol with a boiling point of about 60° C., the amide (I) is a material having a high boiling point, for example, methoxy N-hydroxyethyl propaneamide with a boiling point of about 200° C. Therefore, the alcohol (V) is removed using fractional distillation to obtain an amide (I) compound.

Preferably, fractional distillation is performed together with a nitrogen bubbling in the reaction bath, or vaporization of the alcohol (V) is facilitated by reducing the pressure of the reaction bath. Of course, the two methods may be adopted simultaneously.

Method for Preparing Resist Removing Composition

The resist removing compositions shown in Table 1 are prepared by first preparing an alkoxy N-hydroxyalkyl alkanamide according to the present invention in the above-described manner and then mixing thereto at least one material selected from the group consisting of an attack inhibitor, a material having a dipole moment of 3 or greater, and alkanolamine, in the range of contents as shown in Table 1.

Also, the compositions 1 through 7 shown in Table 1 can be prepared as follows.

First, at least one of 0.01 to 30 weight % of an attack inhibitor and 0.01 to 30 weight % of a polar material, 10 to 70 weight % (preferably 30 to 40 weight %) of alkanolamine and 10 to 70 weight % (preferably, 30 to 40 weight %) of alkyl alkoxy alkanoate are mixed. Preferably, the alkanolamine and alkyl alkoxy alkanoate are mixed in a mixture ratio in which the total amount of alkyl alkoxy alkanoate can completely react with alkanolamine to be converted into amide. The temperature of the mixture is maintained at a temperature in a range from room temperature to about 120° C. Preferably, the mixture is heated to a temperature in the range from about 80° C. to about 90° C. The reaction time is 1 to 24 hours, preferably 1 to 12 hours. After the heating is completed, the reactant is left alone for 1 to 7 hours.

The completion of the reaction can be verified visually or by gas chromatography. In visual verification, layer separation among components is observed to vanish as the reaction progresses. When the separate component layers are observed to completely vanish, the completion of the reaction is presumed. When the composition is analyzed using gas chromatography, the area percentile of N alkanol alkoxy alkanamide exceeding 80% implies completion of the reaction. Area percentile is defined as the area under a peak in the gas chromatography spectrum associated with a component, divided by the sum of the areas under all peaks of all components, and the quotient multiplied by 100.

Subsequently, in order to remove alcohol having a low flash point generated as a by-product, fractional distillation is performed. Fractional distillation is performed together with a nitrogen bubbling in the reaction bath, or vaporization of the alcohol is facilitated by reducing the pressure of the reaction bath. Also, the two methods may be adopted simultaneously. Preferably, the fractional distillation is performed so that 7 to 8 weight % or less of alcohol remains with respect to the total amount of composition.

Method for Removing Resist

The steps of removing the resist using the resist removing agent and resist removing composition according to the present invention will be described with reference to the solid line steps in FIG. 1. Note that the conventional process is represented by both the solid line and the dashed line steps in FIG. 1 Various processes for completing a semiconductor device, for instance, an etching (dry or wet) process or an ion implantation process, are performed using a resist pattern as a mask. Then, an ashing step, which is a dry stripping process, is performed on the substrate where the resist pattern is formed (step 110). The ashing step can be omitted. Subsequently, a substrate where the resist pattern is formed is allowed to contact a resist removing agent or a resist removing composition listed in Table 1 to remove the resist or polymer or both (step 120). This is achieved by placing the resist removing agent or the resist removing composition in a bath and then dipping the substrate into the bath. Alternatively, the resist removing agent or the resist removing composition may be sprayed onto the substrate as the substrate is moved through the spray.

In the case of using the resist removing agent or the resist removing compositions according to the present invention, the resist removal step is performed at a low temperature of about 70° C. or below, specifically, in the range from room temperature to 70° C., preferably, from 45° C. to 70° C. A contact time in the range from about 10 to about 30 minutes is preferred.

The resist removed by the resist removing agent or resist removing composition according to the present invention can be applied to a resist suitable for short wavelength exposure such as a resist for an ArF excimer laser (193 nm), a resist for a conventional i-line (365 nm) resist, or a resist for a KrF excimer laser (248 nm).

After the resist is completely removed, the resist removing agent, the resist removing composition and the dissolved resist remaining on the substrate are rinsed away (step 140). The rinsing step is performed using a rinsing solution, e.g., deionized water. If necessary, the rinsing step can be performed in two steps. Finally, the substrate is dried by a spin drying method or a drying method using isopropyl alcohol to remove the deionized water remaining on the substrate (step 150).

After the drying step 150, the substrate is transferred for subsequent processing. When a resist is used again in a subsequent step, the used resist is again removed through the steps shown in FIG. 1 after the intended subsequent step is completed. The semiconductor device is completed through such repeated unit fabrication processes and resist removal steps.

As shown in FIG. 1, since the resist removing agent or resist removing composition according to the present invention has an excellent capability for removing the resist or polymer, the pre-removal step 100 (dashed lines) is not necessary, unlike the conventional art. Also, since the layer underlying the resist is prevented from being attacked, the post-removal step 130 (dashed lines) can be omitted, also unlike the conventional art. Thus, according to the present, the resist can be completely removed by a simple process, compared to the conventional resist removing process. Therefore, the productivity of semiconductor devices can be remarkably enhanced.

Resist Removing Apparatus

As described above, since the resist removal process is simplified, the resist removing apparatus according to the present invention can be made smaller or more compact.

Figure 2:
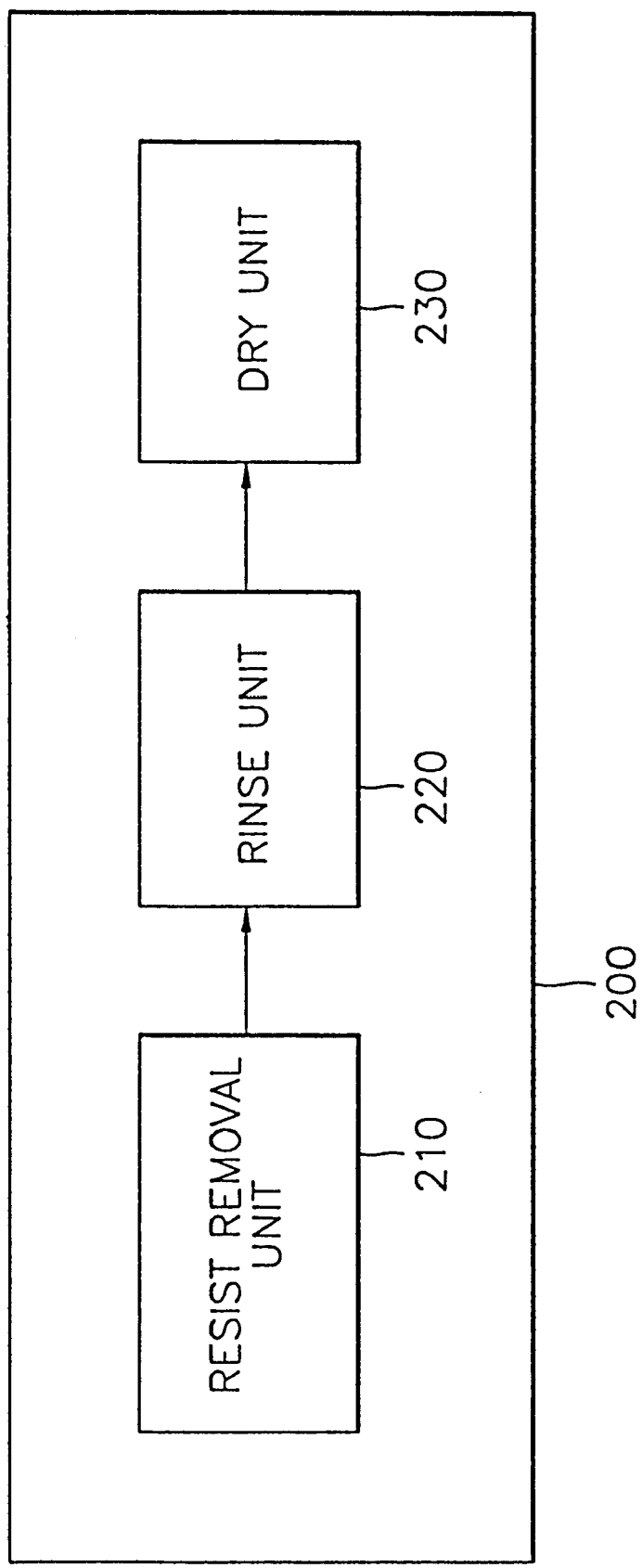
FIG. 2 is a block diagram of a resist removing apparatus using a resist removing agent or a resist removing composition according to the present invention.

Referring to FIG. 2, a resist removing apparatus 200 according to the present invention simply includes a resist removal unit 210, a rinsing unit 220 and a drying unit 230. That is, the conventional pre-removal unit and post-removal unit are not necessary. Thus, the area occupied by the resist removing apparatus 200 can be significantly reduced as compared to the conventional art.

In the case that the resist removing apparatus 200 employs a dipping method, the units 210, 220 and 230 each correspond to an independent bath. Thus, unlike the conventional art, a nitric acid ($HNO_3$) pre-removal treatment bath and an isopropyl alcohol (IPA) post-removal treatment bath are not necessary, thereby eliminating two baths and significantly reducing the area occupied by the resist removing apparatus 200.

A resist removing apparatus employing a spray method can be classified into a horizontal type and a vertical type.

Figure 3:
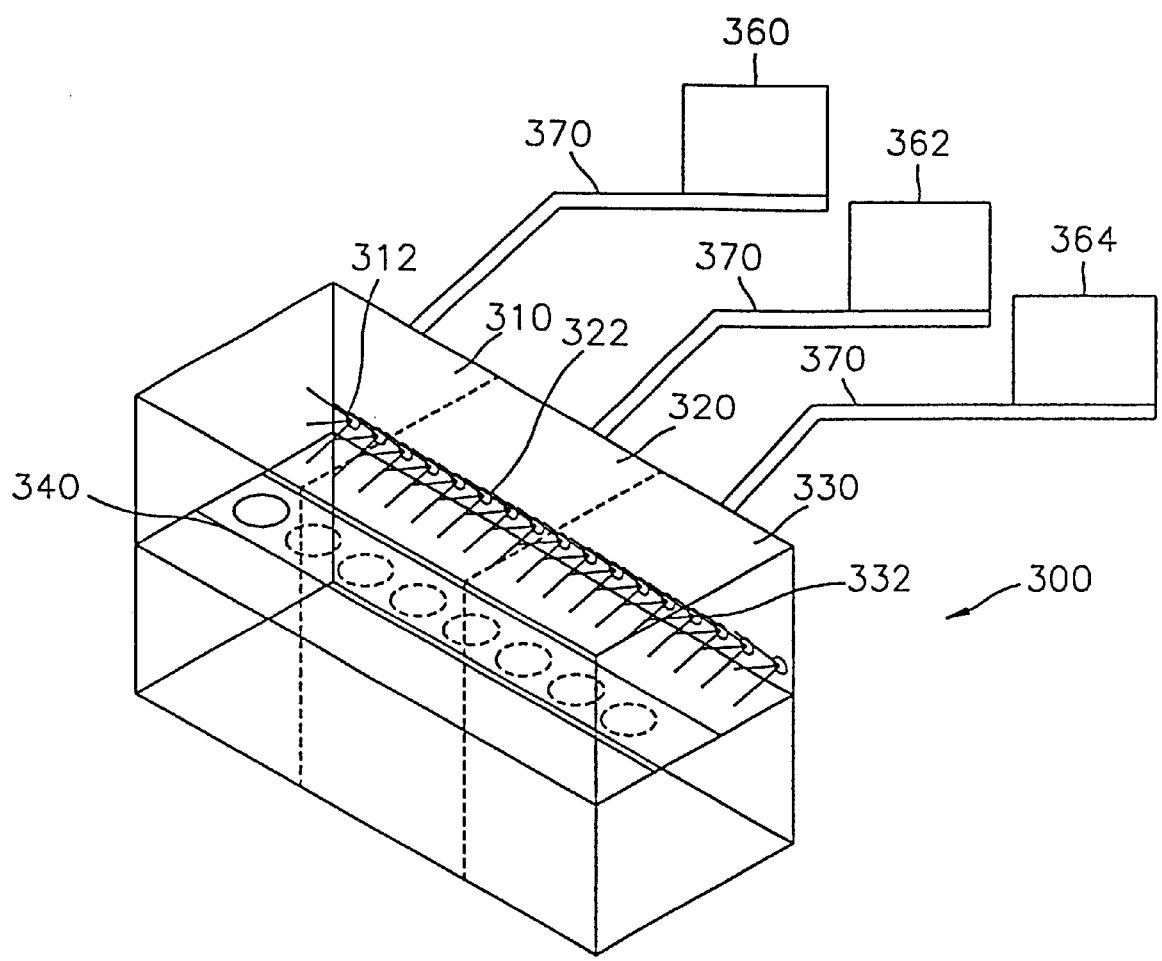
FIG. 3 is a schematic diagram of a horizontal type resist removing apparatus using a resist removing agent or a resist removing composition according to the present invention.

Referring to FIG. 3, a horizontal type resist removing apparatus 300 employs a horizontal carrier means 340, e.g., a conveyor system, a handler, or an arm, and is sectioned into a resist removing unit 310, a rinsing unit 320 and a drying unit 330. A source 360 containing a resist removing agent or a resist removing composition of the present invention supplies the resist removing agent or resist removing composition to the resist removing unit 310 through a supply unit 370. A rinsing solution unit source 362 and a drying agent unit source 364 are also connected to the rinse unit and the drying unit 330 through the supply unit 370, respectively. Nozzles 312, 322 and 332 are installed in the units for spraying materials suitable for functions of the respective units. In operation, when a substrate is loaded into the resist removing unit 310, a resist removing agent or resist removing composition is sprayed from the nozzle 312 to remove the resist. Here, the substrate is continuously conveyed horizontally, by the carrier 340 toward the rinsing unit 320. A rinsing solution is sprayed in the rinsing unit 320 through the nozzle 322. Finally, the substrate is conveyed to the drying unit 330 by the carrier 340 to then be dried by a drying agent, such as air or a drying chemical directed onto the substrate by the nozzle 332. Since the horizontal type resist removing apparatus includes only three units, the size of the apparatus is significantly reduced.

Figure 4:
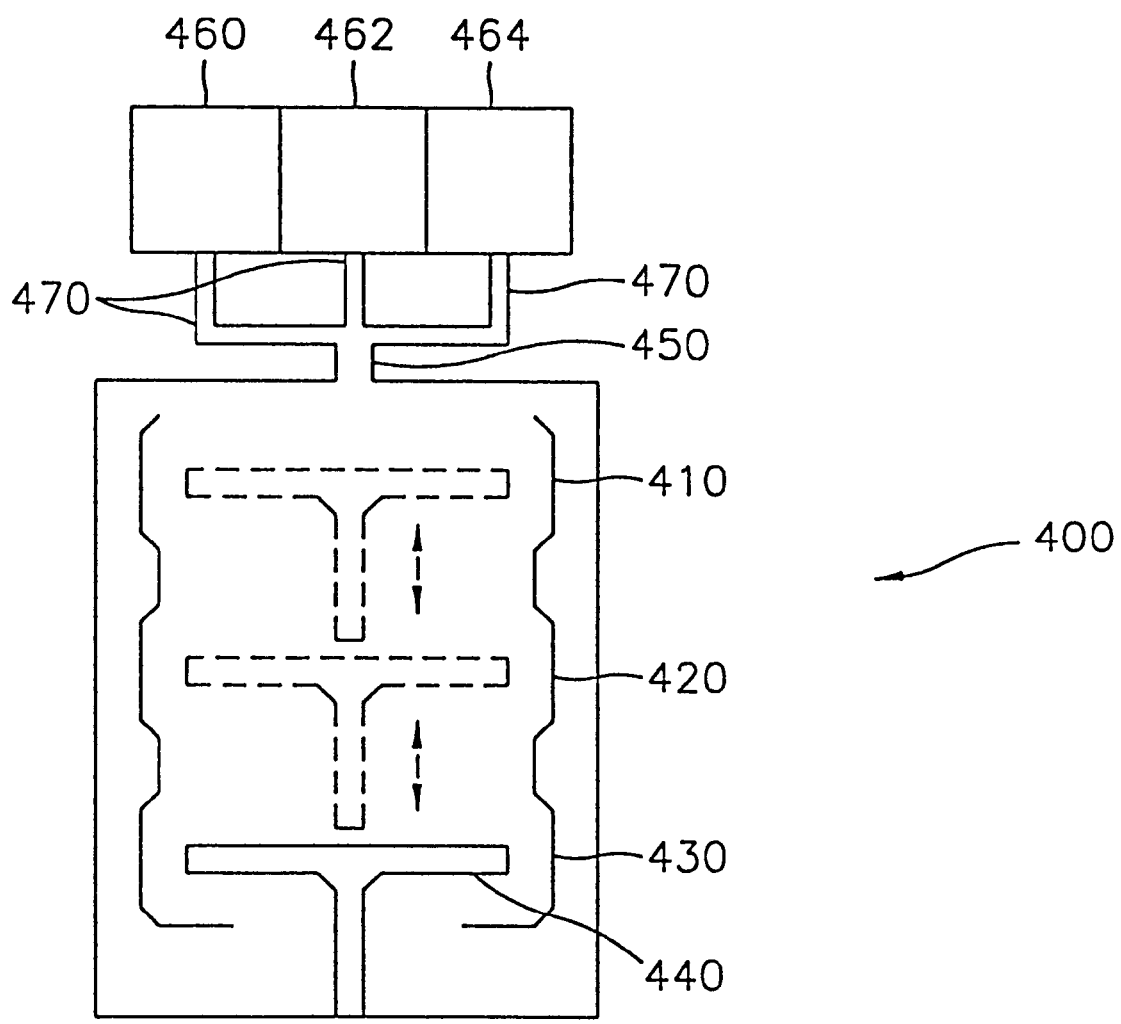
FIG. 4 is a schematic diagram of a vertical type resist removing apparatus using a resist removing agent or a resist removing composition according to the present invention.

Referring to FIG. 4, a vertical type resist removing apparatus 400 employs a vertically movable substrate support 440. The vertical type also includes a source 460 of the resist removing agent or the resist removing composition of the present invention and a supply unit 470 to supply the resist removing agent or resist removing composition. In the preferred embodiment, the substrate support 440 is rotatable. Also, the inside of the apparatus is constructed of three areas, in a bedded structure, vertically displaced with respect to each other, and not independent chambers. That is, the units are composed of a drying area 430, a rinsing area 420 and a resist removal area 410 in vertical sequence. A rinsing solution source 462 and a drying agent source 464 are connected to a supply duct 450 through the supply unit 470. In the embodiment, a single supply duct 450 sequentially provides the respective materials for all three units.

When a substrate (not shown) on which a resist is formed is loaded onto the substrate support 440, the support 440 first moves to an area where the resist removal is performed and a resist removing agent or resist removing composition from the source 460 via the supply unit 470 is sprayed through the supply duct 450. In the preferred embodiment, the resist removing agent or resist removing composition is discharged to the outside through an exhaust duct (not shown). When the resist removal step is completed, the substrate support 440 moves the substrate to the rinsing unit 420 by descending. A rinsing solution is then sprayed into the rinsing unit 420 through the supply duct 450. Finally, the substrate is then carried to the drying unit 430 by the vertical movement of the substrate support 440 to be dried. Although FIG. 4 shows that the drying unit 430, the rising unit 420 and the resist removing unit 410 are disposed vertically in sequence from bottom to top, these units may be vertically disposed in a reverse order. Because the vertical type resist removing apparatus of the present invention also includes only three units, the size of the apparatus is significantly reduced compared to a conventional vertical type apparatus.

The further details of the present invention are described with reference to the following examples, but it is understood that the invention is not limited to these specific examples.

EXAMPLE I

Preparation of Methoxy N-Hydroxyethyl Propanamide 200 ml of monoethanolamine as an alkanolamine and 200 ml of methyl methoxy propanoate as an ester were mixed. Subsequently, the mixture was heated at 90° C. for 5 hours. After heating, the reactant was restored to room temperature for 5 hours.

The resultant material was analyzed by gas chromatography to ascertain that the methoxy N-hydroxyethyl propanamide product was obtained. In addition, the product was analyzed by proton nuclear magnetic resonance ($^1$H-NMR) spectrum giving relative amounts of components in parts per million (ppm). The NMR data of the product is as follows: 6.8 ppm (1H), 3.7–3.8 ppm (4H), 3.4–3.5 ppm (3H), and 2.8–2.9 ppm (1H).

EXAMPLE II

Preparation of Methoxy N Butyl Hydroxyethyl Propanamide 200 ml of N,N t-butyl ethanolamine as an alkanolamine and 200 ml of methyl methoxy propanoate as an ester were mixed. Subsequently, the mixture was heated at 90° C. for 5 hours. After heating, the reactant was restored to room temperature for 5 hours.

The obtained resultant material was analyzed by gas chromatography to ascertain that the methoxy N butyl hydroxyethyl propanamide product was obtained.

EXAMPLE III

Evaluation of an Appropriate Temperature in Preparing Methoxy N Hydroxyethyl Propanamide 200 ml of monoethanolamine (MEA) as an alkanolamine and 200 ml of methyl methoxy propanoate (MMP) as an ester were mixed. Subsequently, to ascertain the temperature suitable for the reaction of amine and ester, the methoxy N hydroxyethyl propanamide was synthesized at different temperatures as shown in Table 2 and the time consumed for the synthesis to be complete was measured. The timing for completion of the synthesis was determined by the elapsed time until the area % of the amide (methoxy N hydroxyethyl propanamide) exceeds 80% as analyzed by gas chromatography.

TABLE 2

| methoxy N hydroxyethyl propanamide Reaction Temperatures and Times | | | | | | | |
|---|---|---|---|---|---|---|---|
| Reaction temperature (° C.) | 25 | 35 | 45 | 55 | 65 | 80 | 90 |
| Reaction time (hr) | 55 | 24 | 30 | 7 | 6 | 4 | 3 |

From the above result, it was understood that the reaction does occur at room temperature and that the reaction occurs more rapidly at higher temperatures. However, in consideration of other processing conditions, it is preferable that the reaction temperature does not exceed 120° C. Thus, the temperature for preparing the amide compound according to the present invention is desirably between room temperature and about 120° C. In the preferred embodiment of the method, the reacting temperature is in the range from about 80° C. to about 90° C.

EXAMPLE IV

Preparation of Resist Removing Composition and Evaluation of Same to Remove the Resist As shown in Table 3, seven (7) resist removing compositions were prepared with MEA, MMP, catechol and water of different contents. Subsequently, the compositions were heated at 80° C. for 5 hours. Next, the resultant material was placed at room temperature for 6 hours. Then, methanol was removed by fractional distillation in which a nitrogen bubbling and a reduced pressure method are both adopted, to complete the compositions.

The resist to be removed using the above-described resist removing composition was prepared in the following manner on each of 7 sheets of substrates. First, BoroPhosphoSilicate Glass (BPSG) layers were formed to a thickness of 5000 Å on 7 sheets of substrates, respectively. Then, a titanium layer and a titanium nitride layer were formed to a thickness of 200 Å, respectively, and heated. Next, an aluminum layer was deposited to a thickness of 6000 Å and then flowed. A titanium nitride layer as a capping layer was formed on the aluminum layer and then an interlevel dielectric layer was formed to a thickness of 10000 Å. Then, a resist was coated on the interlevel dielectric layer and then photolithography was performed to form a resist pattern defining a via hole. The resist pattern was baked and then the interlevel dielectric layer was etched, using the resist pattern as a mask, by a buffered oxide etchant to form a via hole exposing the aluminum layer.

After forming the via hole, the 7 substrates were ashed and dipped into 7 respective baths containing the 7 respective compositions listed in Table 3. The temperatures of the baths were maintained at 60° C. After being submerged for 20 minutes, the substrates were rinsed with water for 5 minutes and dried, and then the substrates were examined using scanning electron microscopy (SEM). The substrates were graded as good, better, best based on the SEM observations, and the grades are indicated in Table 3 using symbols. The state of the substrate is characterized by the relative amounts of remaining polymer and remaining resist.

TABLE 3

Resist Removing Performance of Several Compositions

| Item | MEA(ml) | MMP(ml) | Catechol (g) | Water (ml) | Observations |
|------|---------|---------|--------------|------------|--------------|
| 1 | 50 | 350 | 60 | 100 | ○ |
| 2 | 100 | 300 | 60 | 100 | ○ |
| 3 | 150 | 250 | 60 | 100 | ⊙ |
| 4 | 200 | 200 | 60 | 100 | ⊙ |
| 5 | 250 | 150 | 60 | 100 | ◎ |
| 6 | 300 | 100 | 60 | 100 | ○ |
| 7 | 350 | 50 | 60 | 100 | ○ |

(○: good, ◎: better, ⊙: best)

The good state is the state similar to using the conventional resist removing composition EKC-245, the better state is the improved state compared to the conventional case, and the best state is the significantly improved state compared to the conventional case, respectively. EKC-245 is a conventional resist removing composition having hydroxylamine, diglycolamine, catechol and water as its essential components.

EXAMPLE V

Analysis of Components of Composition

The respective components were mixed in a ratio demonstrated in Table 3 and then the amounts of components of the respective compositions were analyzed after a predetermined time has elapsed. The analysis results showed that the respective compositions include components listed in Table 4.

TABLE 4

Component Composition

| Item | Methoxy N hydroxyethyl propanamine (weight %) | Monoethanolamine (weight %) | Catechol (weight %) | Water (weight %) |
|------|-----|-----|----|----|
| 1 | 71.9 | 0.1 | 13 | 15 |
| 2 | 67 | 5 | 13 | 15 |
| 3 | 62 | 10 | 13 | 15 |
| 4 | 55 | 17 | 13 | 15 |
| 5 | 47 | 25 | 13 | 15 |
| 6 | 42 | 30 | 13 | 15 |
| 7 | 32 | 40 | 13 | 15 |

EXAMPLE VI

Evaluation of Appropriate Processing Time

To verify appropriate processing time, the composition corresponding to item number 4 shown in Table 4 was used, and the resist was removed at different processing times as listed in Table 5. The other processing conditions were the same as those in Example IV. The removal state of the resist and the attacked states of an aluminum layer and a silicon layer were observed using SEM.

TABLE 5

Resist Removing Performance By Time

| Item | Processing time (min) | Observations of resist removing capability | Attacked or not (Al, Si) |
|------|------|-----|-----|
| 1 | 10 | ◎ | x |
| 2 | 15 | ⊙ | x |
| 3 | 20 | ⊙ | x |
| 4 | 25 | ⊙ | x |
| 5 | 30 | ⊙ | x |

(◎: better, ⊙: best)

The symbols in Table 5 representing the observed removal state are the same as those in Table 3. In Table 5, an "x" indicates that the underlying layer is not attacked.

From the result shown in Table 5, it was observed that the most appropriate reaction time for removing the resist includes times from 10 to 30 minutes and that the underlying layer is not attacked at all.

EXAMPLE VII

Evaluation of Appropriate Processing Temperature

To verify appropriate processing temperature, the composition corresponding to item number 4 shown in Table 4 was used, and the resist was removed at different processing temperatures as listed in Table 6. The other processing conditions were the same as those in Example IV. The removal state of the resist and the attacked states of an aluminum layer and a silicon layer were observed using SEM.

TABLE 6

Resist Removing Performance By Temperature

| Item | Processing temperature (° C.) | Observations of resist removing capability | Attacked or not (Al, Si) |
|---|---|---|---|
| 1 | 45 | ⊙ | x |
| 2 | 50 | ⊙ | x |
| 3 | 55 | ⊙ | x |
| 4 | 60 | ⊙ | x |
| 5 | 65 | ⊙ | x |
| 5 | 70 | ⊙ | x |

The symbols in Table 6 are the same as those in Table 5. From the result shown in Table 6, it was observed that the resist removal occurred rapidly in the lower temperature range from about 45° C. to about 70° C.

EXAMPLE VIII

Comparison of Resist Removing Capability

The via hole was formed using the resist pattern in the same manner as that of Example IV, the resist was removed with the composition corresponding to item number 4 shown in Table 4, the processing time was 20 minutes, and the reaction temperature was 60° C. The resultant material was observed using SEM, and the observation results are shown in FIG. 5.

In a comparative example, the resist was removed using the conventional resist removing composition EKC-245, with other conditions being the same as those in the above described examples, and then the resultant material was observed using SEM. The observation results are shown in FIG. 6.

Figures 5, 6:
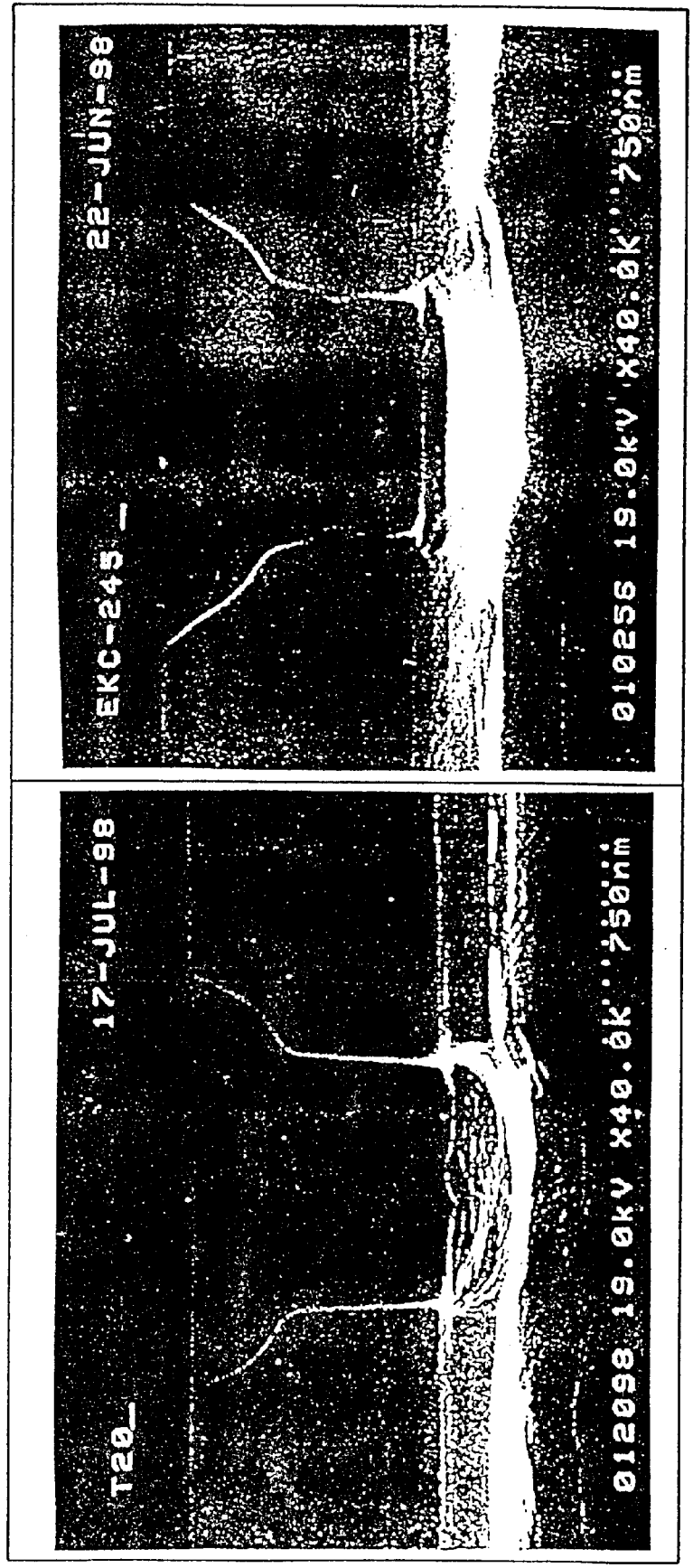
FIG. 5 is a scanning electron microscopic photograph illustrating the removal result of the resist pattern using the resist removing composition according to the present invention.
FIG. 6 is a scanning electron microscopic photograph illustrating the removal result of the resist pattern using the conventional resist removing composition.

When the SEM photographs shown in FIGS. 5 and 6 are compared, one can see the resist was completely removed when the resist removing composition according to the present invention was used, while the resist partially remains when the conventional resist removing composition, e.g., EKC-245, was used. Also, although the underlying aluminum layer was not attacked in the present invention, the aluminum layer was attacked partially in the case of using EKC-245.

EXAMPLE IX

Measurement of the Effect of Attack on Copper Layer

Figure 7:
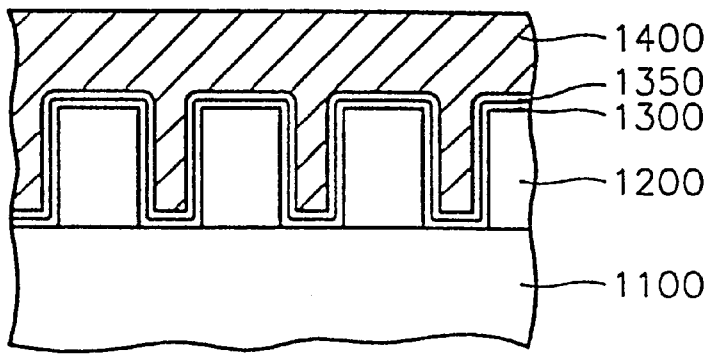
FIG. 7 is a cross-sectional view of a substrate having a copper layer, which is not treated with a resist removing composition.

As shown in FIG. 7, to ascertain the effect of attack on a copper layer to which much attention has been paid as a next generation interconnection layer, first, a BPSG layer 1200 was formed on each of a plurality of substrates 1100 to a thickness of 5000 Å, and then the BPSG layer of each substrate was patterned using photolithography to form a plurality of contact holes. Subsequently, titanium/titanium nitride layers 1300 and 1350, functioning as a barrier metal layer, were sequentially formed on the surface of the contact holes to a thickness of 200 Å, respectively, and then a copper layer 1400 filling the respective contact holes was formed to a thickness of 10000 Å.

Then, the plurality of substrates were divided into three groups A, B and C. Group A was not treated with any resist removing composition, group B was dipped in a resist removing composition corresponding to item number 4 shown in Table 4 at 65° C. for 100 minutes, and group C was dipped in a conventional resist removing composition (EKC-245) at 65° C. for 100 minutes.

Figure 8:
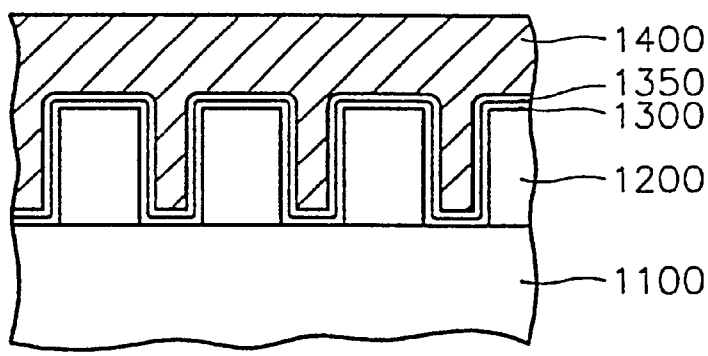
FIG. 8 is a cross-sectional view of a substrate having a copper layer, which is treated with a resist removing composition according to the present invention.
Figure 9:
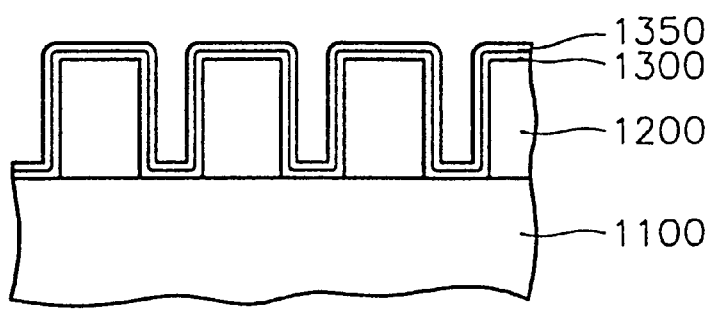
FIG. 9 is a cross-sectional view of a substrate having a copper layer, which is treated with a conventional resist removing composition.

Continuously, some substrates of each group were observed using SEM. FIG. 7 shows the case when a substrate was not treated with a resist removing composition (group A), and FIG. 8 shows the case when a substrate was treated with a resist removing composition according to the present invention (group B). In the case of using the resist removing composition according to the present invention, the same result as in the case of not treating the substrate with a resist removing composition was achieved, which is the desired result. In other words, it was ascertained that the resist removing composition according to the present invention did not attack the copper layer at all. However, in the case of using a conventional resist removing composition (group C), as shown in FIG. 9, the copper layer was attacked so severely that the copper layer was almost completely removed. From the results shown in FIGS. 7 through 9, etch rates of the copper layer can be calculated. The calculated etch rates are listed in the following Table 7.

TABLE 7

Etch Rate of Copper Layer

| Group | A | B | C |
|---|---|---|---|
| Etch rate (Å/min) | 0 | 0 | >1000 |

Figure 10:
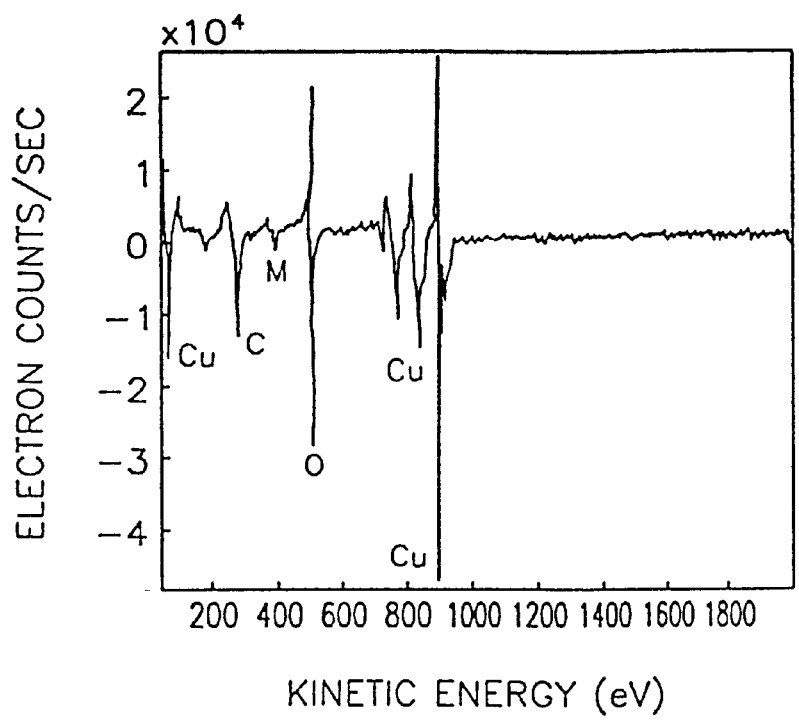
FIG. 10 is a graph illustrating the observation result for the copper layer formed on a substrate using Auger Electron Spectroscopy before the substrate having a copper layer is treated with a resist removing composition according to the present invention.
Figure 11:
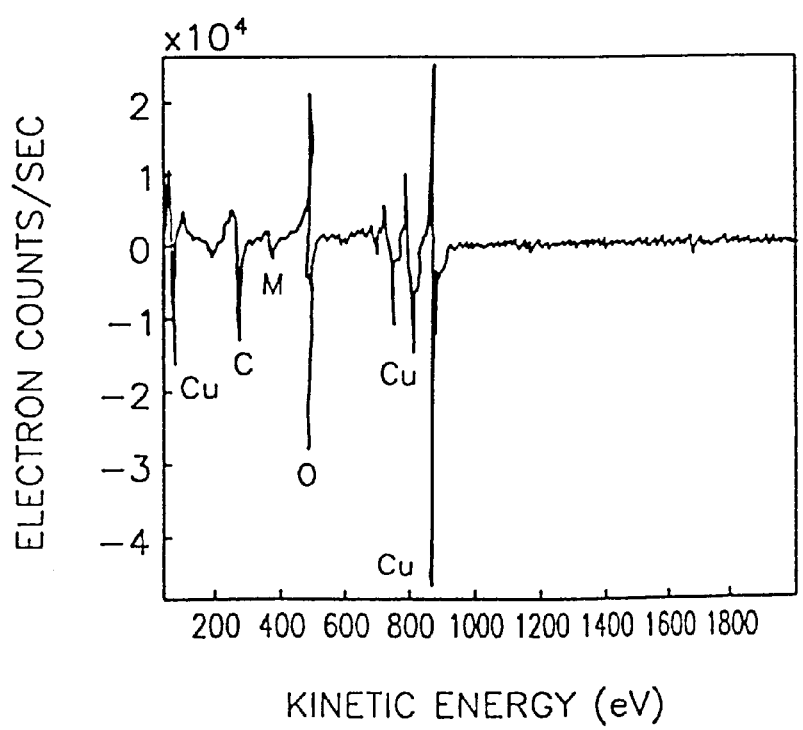
FIG. 11 is a graph illustrating the observation result for the copper layer formed on a substrate using Auger Electron Spectroscopy after the substrate having a copper layer is treated with a resist removing composition according to the present invention.

To ascertain the effect of the resist removing composition according to the present invention on the surface of the copper layer, the surface of a copper layer of group A (without treatment of a resist removing composition) and the surface of a copper layer of group B (with treatment of the resist removing composition according to the present invention) were analyzed by Auger Electron Spectroscopy, and the analysis results are shown in FIGS. 10 and 11, respectively. As shown in FIGS. 10 and 11, the resist removing composition according to the present invention did not exhibit any effects on the copper layer, since the Auger electron spectra shown in FIGS. 10 and 11 were substantially the same.

EXAMPLE X

Analysis of Components of Resist Removing Composition

Figure 12:
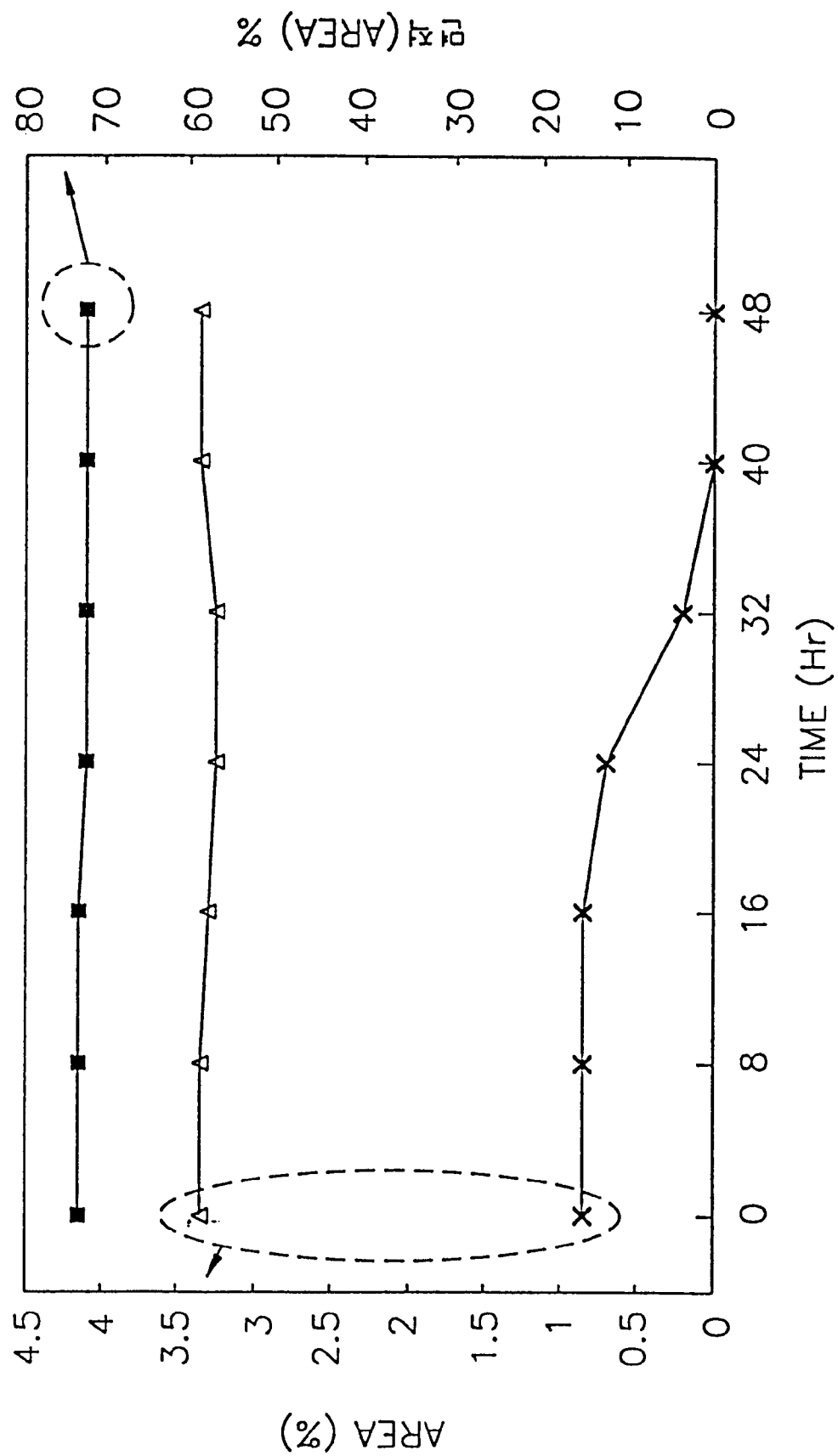
FIG. 12 is a graph illustrating the change in contents of components of the resist composition, measured by gas chromatography for 48 hours at intervals of 8 hours.

The amount of components of the resist removing composition corresponding to item number 4 shown in Table 4 were analyzed by gas chromatography at 8 hour intervals. The analysis results are shown in FIG. 12, in which -■- is the area % of amide, -Δ- is the area % of monoethanolamine, and -x- is the area % of methyl methoxy propanoate, respectively. From the results shown in FIG. 12, it was observed that the area % of amide was constant at about 80% even after 48 hours had elapsed. Also, the area % of monoethanolamine was constant at 3.4. The area % of methyl methoxy propanoate was reduced from 0.9 to 0.5 after 24 hours elapsed, until it became essentially 0 after 40 hours. Also, it was understood that the composition according to the present invention, which had undergone the reaction completely and became stabilized, contained amide, amine, catechol and water. Considering that the main active component of the composition according to the present invention is amide, little change in the content of the amide even after 48 hours implies that the composition according to the present invention is not quickly, consumed in the process and can be used for a long time. This means that the composition according to the present invention can enhance the productivity and can reduce the manufacturing cost significantly, unlike the conventional resist removing composition EKC-245 which must be replaced every 24 hours.

The amide compound according to the present invention has a capability for removing a resist. Thus, the resist removing agent having the amide compound or resist removing composition according to the present invention has an excellent capability for removing a resist and can effectively remove polymer and organometallic polymer. Also, the layer underlying the resist may not be attacked. Therefore, when the resist removing agent or resist removing composition according to the present invention is used, it is not necessary to perform a pre-removal step for removing the polymer and a post-removal step for preventing the underlying layer from being attacked. Thus, the resist removing process can be simplified and the processing time can be reduced. Also, the temperature required for removing the resist can be set to a lower temperature. Further, the resist removing apparatus can be simplified and made more compact.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

What is claimed is:

1. A resist removing method comprising:
   providing a substrate;
   forming a resist on the substrate; and
   contacting the substrate with a resist removing agent comprising alkoxy N-hydroxyalkyl alkanamide to remove the resist from the substrate.

2. The resist removing method according to claim 1, wherein the alkoxy N-hydroxyalkyl alkanamide is of the formula (I):

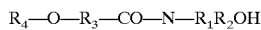

wherein:
   $R_1$ is a hydrogen atom, a $C_1$ to $C_5$ hydrocarbon, or an aromatic hydrocarbon having 1 to 3 rings,
   $R_2$ is a $C_1$ to $C_5$ hydrocarbon or an aromatic hydrocarbon having 1 to 3 rings, and
   $R_3$ and $R_4$ are, independently, a $C_1$ to $C_5$ hydrocarbon.

3. The resist removing method according to claim 2, wherein $R_1$ is hydrogen, $R_2$ is —CH$_2$CH$_2$—, $R_3$ is —CH$_2$CH$_2$—, and $R_4$ is —CH$_3$.

4. A resist removing method comprising:
   providing a substrate;
   forming a resist on the substrate; and
   contacting the substrate with a resist removing composition to remove the resist from the substrate, the resist removing composition comprising alkoxy N-hydroxyalkyl alkanamide, and at least one compound selected from a group consisting of a polar material having a dipole moment of 3 or greater, an attack inhibitor, and alkanolamine.

5. The method according to claim 4, wherein, during said contacting, the alkoxy N-hydroxyalkyl alkanamide is of the formula (I):

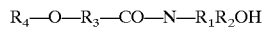

wherein:
   $R_1$ is a hydrogen atom, a $C_1$ to $C_5$ hydrocarbon, or an aromatic hydrocarbon having 1 to 3 rings,
   $R_2$ is a $C_1$ to $C_5$ hydrocarbon or an aromatic hydrocarbon having 1 to 3 rings, and
   $R_3$ and $R_4$ are, independently, a $C_1$ to $C_5$ hydrocarbon.

6. The method according to claim 4, wherein, during said contacting, the polar material is one selected from a group consisting of water, methanol and dimethylsulfoxide.

7. The method according to claim 4, wherein, during said contacting, the attack inhibitor is a compound represented by formula (II):

wherein:
   $R_6$ is a $C_1$ to $C_5$ hydrocarbon, a $C_1$ to $C_5$ hydrocarbon having a —COOH group, an aromatic hydrocarbon having 1 to 3 rings, or an aromatic hydrocarbon having 1 to 3 rings having a —COOH group; and
   n is an integer from 1 to 4.

8. The mlethod according to claim 4, wherein, during said contacting, the alkanolamine is of the following formula (II):

wherein:
   $R_1$ is hydrogen, a $C_1$ to $C_5$ hydrocarbon, or an aromatic hydrocarbon having 1 to 3 rings; and
   $R_2$ is a $C_1$ to $C_5$ hydrocarbon or an aromatic hydrocarbon having 1 to 3 rings.

9. The method according to claim 4, wherein, during said contacting, the alkoxy N-hydroxyalkyl alkanamide is in a range from about 30 to about 99.9 weight % of the resist removing composition.

10. The emthod according to claim 4, wherein, during said contacting, the polar material and the attack inhibitor are, independently, in a range from about 0.01 to about 30 weight % of the resist removing composition.

11. The method according to claim 4, wherein, during said contacting, the alkanolamine is in a range from about 0.1 to about 70 weight % of the resist removing composition.

12. The method according to claim 4, wherein, during said contacting, the alkoxy N-hydroxyalkyl alkanamide, the alkanolamine, the polar material and the attack inhibitor are in a range from about 40 to about 65 weight % of the resist removing composition, in a range from about 5 to about 30 weight % of the resist removing composition, in a range from about 5 to about 20 weight % of the resist removing composition, and in a range from about 5 to about 20 weight % of the resist removing composition, respectively.

13. The method according to claim 4, after said contacting, further comprising: rising the substrate; and
   drying the substrate.

14. The method according to claim 4, before said contacting, further comprising ashing the substrate.

15. The method according to claim 4, wherein said contacting is performed at a temperature in a range from about 45° C. to about 70° C.

* * * * *